United States Patent [19]

Van Rijn

[11] Patent Number: 5,753,014
[45] Date of Patent: May 19, 1998

[54] MEMBRANE FILTER AND A METHOD OF MANUFACTURING THE SAME AS WELL AS A MEMBRANE

[76] Inventor: Cornelis Johannes Maria Van Rijn, Gerard Doustraat 10, 1072 VP Amsterdam, Netherlands

[21] Appl. No.: 646,351

[22] PCT Filed: Nov. 14, 1994

[86] PCT No.: PCT/EP94/03783

§ 371 Date: May 10, 1996

§ 102(e) Date: May 10, 1996

[87] PCT Pub. No.: WO95/13860

PCT Pub. Date: May 26, 1995

[30] Foreign Application Priority Data

Nov. 12, 1993 [NL] Netherlands ............. 9301971
Aug. 1, 1994 [NL] Netherlands ............. 9401260

[51] Int. Cl.⁶ .................................. B01D 53/22
[52] U.S. Cl. ................. 96/12; 96/8; 96/13; 55/524; 55/DIG. 5
[58] Field of Search ............ 96/8, 10–13; 55/524, 55/DIG. 5

[56] References Cited

U.S. PATENT DOCUMENTS

| | | | |
|---|---|---|---|
| 3,717,525 | 2/1973 | Bültemann | 96/11 X |
| 4,329,157 | 5/1982 | Dobo et al. | 96/8 X |
| 4,483,901 | 11/1984 | Okita et al. | 96/12 X |
| 4,655,797 | 4/1987 | Iniotakis et al. | 96/11 X |
| 4,801,380 | 1/1989 | Parker et al. | 210/500.21 |
| 4,865,630 | 9/1989 | Abe | 96/11 |
| 4,971,696 | 11/1990 | Abe et al. | 96/11 X |
| 5,151,110 | 9/1992 | Bein et al. | 95/143 X |
| 5,238,471 | 8/1993 | Blanchet-Fincher | 96/13 |
| 5,415,891 | 5/1995 | Liu et al. | 96/11 X |
| 5,429,743 | 7/1995 | Geus et al. | 96/11 X |

FOREIGN PATENT DOCUMENTS

| | | | |
|---|---|---|---|
| 0 092 840 | 11/1983 | European Pat. Off. | |
| 0 272 764 | 6/1988 | European Pat. Off. | |
| 0 278 059 | 8/1988 | European Pat. Off. | |
| 0 325 752 | 8/1989 | European Pat. Off. | |
| 0 511 739 | 11/1992 | European Pat. Off. | |
| 0 550 071 | 7/1993 | European Pat. Off. | |
| 59-213402 | 12/1984 | Japan | 96/11 |
| 61-238303 | 10/1986 | Japan | 96/11 |
| 1-262903 | 10/1989 | Japan | 96/11 |
| 6-007630 | 1/1994 | Japan | 96/11 |
| 2078539 | 1/1982 | United Kingdom | 95/56 |
| WO 93/23154 | 11/1993 | WIPO. | |

*Primary Examiner*—Robert Spitzer
*Attorney, Agent, or Firm*—Young & Thompson

[57] ABSTRACT

A membrane filter comprises a membrane provided with pores with a pore size between 5 nm and 50 μm. The membrane may easily and reliably be processed with use of silicon micromachining through depositing a relatively thin membrane layer on a support, by use of a suitable vapour deposition or spincoating technique, after which perforations are made in the thin membrane layer, for example by etching with aid of photo-lithography or an imprint technique. Such a membrane is very well applicable for the separation of biological cells. A membrane with a thickness smaller than the diameter of the perforations is in particular suited for the separation of vulnerable cells and may be used as a leucocyte filter or as a blood plasma separator of blood concentrates. A microfiltration membrane according to the invention may very well be applied as a support for the deposition of a separation layer for ultrafiltration, gas separation or catalysis.

21 Claims, 8 Drawing Sheets

MEMBRANE FILTER AND A METHOD OF MANUFACTURING THE SAME AS WELL AS A MEMBRANE

FIELD OF THE INVENTION

The present invention relates to a membrane filter comprising a membrane provided with pores having a pore size typically between 5 nm and 50 μm. The present invention further relates to a method of manufacturing such a membrane filter and to a membrane of the kind applied in such a membrane filter as well as various utilizations thereof.

BACKGROUND OF THE INVENTION

A membrane filter of the type described in the opening paragraph is frequently used for microfiltration, ultrafiltration, gas separation and catalysis and is known from a European Patent Application with publication number 325.752. The known micro filtration membrane filter comprises a layer of a polymer, glass or ceramics which has been provided with pores by means of a laser. The pores are formed by burning perforations in the layer with a pulsated KrF-Excimer-laser. Relatively small pores, having a size of about 0.5 μm, are formed by means of crossing interference line patterns. In that case the pores are formed at the junctions of the interference lines.

These known membrane filters however are mechanically relatively weak and will foul relatively easily which will prevent them from achieving a very high flow rate or flux. In order to filtrate with a high flow rate the membrane should be made as thin as possible in which case the known membrane filter will not be capable any more to withstand the mechanical forces exerted on it during filtration.

Moreover the known membrane filter suffers from a relatively poor bio-compatibility rendering it practically unsuitable for medical purposes. Further the manufacturing of the known filter will be rather sensitive to process fluctuations as the adjustment of the laser apparatus is very critical with respect to the thickness of the membrane layer, the material of the membrane layer, the light intensity and the like. As a consequence the size of the individual pores will strongly depend on variations in the thickness of the layer, temperature fluctuations, laser energy stability and so on, which makes it hard, if not impossible, to form a filter with a sharp, well defined pore size distribution over a large membrane surface.

SUMMARY OF THE INVENTION

It is an object of the present invention to circumvent these disadvantages by providing for a membrane filter of the type described in the opening paragraph which is mechanically comparatively strong, highly bio-compatible and features a sharp, well defined pore size distribution. The present invention further provides for a method by which such an improved filter may readily be manufactured.

A membrane filter of the type described in the opening paragraph is according to the invention characterized in that said membrane comprises a substantially flat layer of substantially uniform thickness and in that the surface of said layer is substantially void of any protrusions or any other irregularities. The uniform thickness of the membrane of the filter according to the invention gives the filter a homogeneous lateral stress distribution over a large area. As a result, it will not, or at least less, give rise to lateral stress concentrations during operation, contrary to the known filter, which comprises a membrane which suffers from considerable thickness variation and in which mechanical stress moreover will tend to concentrate in the depressed portions between adjacent pores. Accordingly the filter of the present invention will be considerably less prone to breakage or other destruction during operation and, as a consequence, can be made considerably thinner facilitating an enhanced flow rate. In this respect proper results were obtained with a specific embodiment of the membrane filter according to the invention which is characterized in that the membrane has a thickness between 20 nm and 5 μm with a thickness uniformity ranging from 10 nm to 100 nm respectively. Due to its thickness uniformity this membrane filter has proven to withstand the forces exerted on it during filtration even at comparatively large flux. To enhance the flow rate the filter should present a resistance which is as low as possible and therefore, in a preferred embodiment of the invention, comprises a membrane whose thickness is smaller than the average pore size and whose pore density is larger than 1 million per square centimeter.

The filter of the invention moreover appears to be highly bio-compatible. In this respect the invention is based on the recognition that a smooth membrane with a surface roughness much less than the pore size will prevent sticking of particles or cells on the membrane and in the perforations. This improves the biocompatibility and renders the filter of the invention applicable for vulnerable cell-cell separation techniques and other medical and bio-medical purposes. As such, good results were obtained with a specific embodiment of the invention in which the membrane as well as the inner surface of the pores have a surface roughness less than 100 nm, particularly less than 10 nm and in which the membrane has a thickness which is smaller than the average diameter of the pores. Such a membrane filter may be used for the separation of biological cells and is particularly useful if vulnerable particles or stress-sensitive cells should be separated with a high flow rate. Some cells, e.g. leucocytes, erythrocytes and blood platelets will show an enhanced stiffening of their cell-membrane whenever they enter narrow and long pores, and will stick inside these pores (leucocytes) or release their cell content (erythrocytes, blood platelets). The latter is avoided or at least counteracted by this specific embodiment of the membrane filter of the invention.

The ultimate selectivity of a filter is determined by its largest pores. Consequently it is desirable to have a pore size distribution which is as sharp as possible. In order to offer a large selectivity a specific embodiment of the filter according to the invention is characterized in that the pores consist of etched perforations with relatively smooth edges and in that the membrane features a relatively sharp, well defined pore size distribution within a standard deviation of less than 3%, particularly less than 1%. Due to the sharp pore size distribution of this filter, it moreover provides for a highly selective and reliable filtration which further adds to its serviceability not only for medical applications but in all circumstances in which micro filtration, ultra filtration, gas separation and catalysis have to be performed with a comparatively large flux and reliability.

Depending on the application, the perforations in the membrane may be cylindric or tapering. The latter has an advantage in 'back flush' applications, clogged perforations are easily reopened by means of a counter pressure pulse. Suitable materials for the membrane of the filter according to the invention are preferentially composed of inorganic or ceramic components like silicon, carbon, silicon oxide, silicon nitride, silicon oxynitride, silicon concarbide, silicides, alumina, zirconium oxide, magnesium oxide, chromium oxide, titanium oxide, titanium oxinitride and titanium nitride and yttrium barium copper oxides. A metal or an alloy with palladium, tungsten, gold, silver, chromium, nickel, steel, an iron alloy, tantalum, aluminum and titanium may also be used as a membrane material. With a conductive metal or a superconductive material, electro chemical separation applications will be possible. Alternatively, a polymeric material may be used for the membrane of the filter like, polyurethane, polytetrafluoroethylene (TEFLON), polyamide, polyamide, polyvinyl, polymetamethylacrylate, polypropylene, polyolefin, polycarbonate, polyester, cellulose, polyformaldehyde and polysulfon. For some economic applications (disposables) a membrane made of a photosensitive layer, like polyamide or polymetamethylacrylate may already fulfil the need. For biomedical applications the membrane may be composed of a biocompatible material like silicon nitride, silicon carbide, silicon oxynitride, titanium, titanium oxyde, titanium oxynitride, titanium nitride, polyamide and polytetrafluoroethylene (TEFLON). The membrane may also be provided with a biocompatible coating of these materials, or provided with another biocompatible coating, for example a heparin coating.

To further enhance the strength of the filter, a specific embodiment of the filter according to the invention is characterized in that the membrane is carried by a macroporous support with at least one opening at its surface which is spanned by the membrane. The support may have a flat surface or be tubular, and avoids that the membrane is put under tension in its entirety, and accordingly limits the forces excerted on it. In a further embodiment, the filter is characterized in that the pores are provided within said at least one opening merely at a distance from its boundary and at a distance from its centre. The distance between the pore structure and the boundary and centre of the opening(s) in the support is determined by the bending characteristic of the membrane when put under pressure, such that the pores are specifically omitted from those parts of the membrane which will bend the most and hence experience the largest tension during operation. In that event, not only the support itself adds to the strength of the filter, but also said specific location of the pores within the opening(s), which accordingly is selectively chosen to serve the mechanical strength of the membrane and hence the filter.

Between the membrane layer and the support an intermediate layer may be deposited for bonding enhancement and stress reduction consisting of e.g. borax, chromium, nickel, titanium, silicon oxide or phosporous pentoxide. In particular cases, the intermediate layer may moreover act as an etch stop layer. Appropriate materials for the support itself are organic as well as inorganic materials like silicon, steel, iron alloys, carbon, silicon oxide, silicon nitride, silicon oxynitride, silicon carbide, alumina, zirconium oxide, magnesium oxide, titanium oxide, titanium oxynitride, titanium nitride, chromium, nickel, aluminum, titanium, polytetrafluoroethylene, polyamide, polyamide, polyvinyl, polymetamethylacrylate, polypropylene, polyolefin, polycarbonate polyester, cellulose, polyformaldehyde, polysulfon and glass-like materials. For biomedical applications the support may be made of a biocompatible material, like silicon nitride, silicon carbide, titanium nitride, titanium, titaniumoxyde, polytetrafluoroethylene and polycarbonate.

The support may be macroporous with a tortuous pore structure, a sintered ceramic material, a sintered metal powder or a polymeric tortuous membrane, as well as an initial dense material in which in a later stage openings are made, for example in a semiconductor wafer, a metal support or an inorganic disc. Favourably the macroporous perforations are etched in the support through the pores in the membrane. The total strength of the membrane may be increased by a number of relatively thin supporting bridges in the support underneath. Good results are obtained if the support has openings with a mean cross section that is 5 to 100 times the cross section of the pores of the membrane.

A relatively thick membrane or a membrane with a low intrinsic stress 'stress deficient', has the advantage that openings in the support may be designed relatively large, for example openings with a diameter larger than 100–10000 times the thickness of the membrane. For low pressure applications, the support may be omitted. A support with relatively large and smoothly etched openings, e.g. in a monocrystalline silicon wafer, has an advantage in vulnerable cell separation applications. The support has favourably a thickness between 10 to 1000 times the thickness of the membrane, typically the support has a thickness between 100 to 10000 µm. Depending on application, the support may be flat, tube-like or otherwise formed. Tube-like supports have proven to be advantageous in cross flow applications. In order to add to the bio-compatibility of the filter as a whole, the openings in the support preferably have a surface roughness less than 50 nm.

Good results are obtained with a membrane filter according to the invention having a <100> silicon support with thickness 380 µm and square openings of 200×200 µm carrying a 1 µm thick membrane of silicon nitride with perforations of 0.5–5 µm. In blood filtration experiments using 'buffy coat' erythrocyte concentrates no haemolysis was observed and excellent leucocyte retention (>99%) was found with a membrane with pore size 2 µm at pressures below 10 cm $H_2O$. In leucocyte filtration experiments using 'buffy coat' blood platelet concentrates no blood platelet activation was observed and excellent leucocyte retention (>99%) was found with a membrane with pore size 4µm at pressures below 10 cm $H_2O$.

In a preferred embodiment of the filter according to the invention, the support and the membrane are constituted from equivalent materials with the same or similar components, for example silicon. A filter of this kind is applicable in a wide temperature range, with a good cohesion between the support and the membrane.

Alternatively a membrane of the kind used in the filter according to the invention may itself very well act as a support for an ultrafiltration or a gas separation layer of for instance a metal or porous silicon. Very thin ultrafiltration or gas separation layers with a thickness less than 200 nm may be deposited in or over the perforations of the membrane to constitute an ultrafiltration filter or gas separation filter respectively. The ultrafiltration or gas separation layer may be deposited, for example by means of a suitable deposition technique, like spin coating, dipping, sol/gel, sputtering, vapour deposition and crystallization. A gas separation layer supported by a ceramic perforated membrane according to the invention has the advantage of a high temperature resistance, and in particular a supporting membrane of silicon has the advantage of a relatively high thermal conductivity and a thermal expansion coefficient with a value between a ceramic material and a metal.

A membrane of the kind used in the filter of the invention may further be used as a mould, as an optical filter or grating, in a microsensor or actuator or in a fractionating system for sorting particles, including cells, on size.

The present invention further relates to a method by which a membrane filter with a membrane featuring pores with a size typically between 5 nm and 50 µm may easily and readily be manufactured with a substantially uniform membrane thickness.

According to the invention a method of manufacturing a membrane filter comprising a support which is covered by a membrane having pores of a size between 5 nm in and 50 µm is characterized in that a membrane layer is deposited on said support and in that the membrane layer is provided with pores by means of a patterned auxiliary layer. Any re-deposition of material removed during the pore formation may easily be avoided in this method of the invention contrary to the known method by which the known membrane filter is realised which almost inevitably suffers from a considerable amount of re-deposition of evaporated material, resulting in a poor surface smoothness and a large number of protrusions and other irregularities of the membrane surface. Accordingly the method of the invention greatly enhances the bio-compatibility of the ultimate filter.

More particularly, in a specific embodiment of the inventive method, the membrane layer is deposited by means of epitaxial growth, spin coating, vapour deposition or sputtering with a thickness between 20 nm and 5 µm. With such a deposition technique, available from for instance semiconductor technology, the membrane layer may readily be deposited void from any protrusions or other irregularities and with a thickness uniformity ranging from less than 10 nm in case of a layer thickness of 20 nm to less than 100 nm for a 5 µm thick layer. Accordingly a membrane filter according to the invention, described hereinbefore, may very well be realised by this method. For thicker membrane layers alternatively use may be made of spraying, sol-gel plating or electroplating for the deposition of the membrane layer which however renders a less smooth surface than the above deposition techniques.

In a specific embodiment of the method of the invention a deposited masking layer, particularly of photo-sensitive material, is employed as the auxiliary layer which is brought in the desired pattern by means of a photo-lithographic or imprinting technique. The masking layer will be in contact with the membrane layer and therefore enables the transfer of its pattern to the membrane layer with a very high degree of precision. The masking layer may be provided with the desired pattern by means of any suitable photo-lithographic or imprinting technique, readily available in the field of for instance semiconductor technology and Compact Disc technology respectively.

In a specific embodiment of the method of the invention, the pattern of the masking layer, determining the size and location of the pores, is transferred to the membrane layer by providing the masking layer on the membrane layer and by subsequently etching the membrane layer while using the patterned masking layer as an etching mask. In this manner the pores may be obtained with a very high degree of precision and with a very smooth inner surface which greatly improves the bio-compatibility of the ultimate filter. Isotropic as well as anisotropic etching techniques may be used for pore etching. Isotropic etching, for instance using a wet etchant, has the advantage that because of inevitable under etching more or less tapered pores are created where as anistropic etching, for instance by means of a plasma, leads to a very precise transfer of the pattern of the masking layer to the membrane layer and thereby facilitates a very sharp pore size distribution in the eventual filter. With anisotropic reactive ion etching based on fluorine or chlorine plasmas it is possible to etch perforations with a depth that is 10 to 20 (=Aspect Ratio) times the mean diameter of the perforations.

Alternatively the pattern of the masking layer may be transferred to the membrane layer by means of a lift-off process in which the masking layer is provided on the support, the membrane layer is deposited on the patterned masking layer and the pores are provided in the membrane layer by subsequently lifting-off the corresponding parts of the membrane layer together with the subjacent parts of the masking layer. Through this relatively inexpensive process a filter may readily be realised, though with a larger surface roughness and consequently lower bio-compatibility than the specific method described in the preceding paragraph. Nevertheless, the present embodiment may very well be used in case the bio-compatibility and the surface roughness of the ultimate filter are not of the utmost importance.

A method for the production of a membrane with ultra fine pores is characterized in that a first layer is deposited on a substrate which is provided with substantially parallel grooves, in that a sacrificial layer is conformally deposited over the surface, in that the sacrificial layer is provided with substantially parallel grooves which extend substantially transverse to the grooves in the first layer, in that a second layer is deposited over the entire surface covering the sacrificial layer and filling the grooves, in that the second layer is etched back until the lateral parts of the sacrificial layer are exposed, in that the exposed parts of the sacrificial layer are removed by etching and in that the substrate is etched through the realised openings in the sacrificial layer formed. In this process channel like perforations are formed between the first layer and the groove filling second layer with a width equal to the thickness of the sacrificial layer, which may be chosen as small as 5 nm. Other processes are equally well applicable, however this process does not need alignment conditions for the masks that are used for the definition of the parallel grooves and the line pattern.

For some applications the perforations in the membrane layer may be narrowed by coating it with an additional layer, for instance by means of spraying, lacquering, spin coating, vapour deposition or sputtering. This additional layer may also be a biocompatible coating.

A preferential process for production of a membrane having a support according to the invention is that openings in the support are etched after the provision of the membrane on the support. Without use of a mask this may be accomplished via the pores of the membrane layer or with use of an etch mask on the backside of the support A process for the production of a membrane having a macroporous support, is characterized in that prior to the deposition of the membrane layer, a suitable pore filling material is deposited on the surface of the macro porous support. The pore filling material may be polysilicon, aluminum, a polymeric material, a material that melts at low temperature and the like. An efficient method is removing the pore filling material by heating the porous support The pore filling material may also removed after the provision of the perforations in the membrane layer by means of etching the pore filling material selectively through the perforations of the membrane layer.

Preferably, a photosensitive lacquer layer is used both as a pore filling layer, as well as a pattern forming layer. Exposure of a relatively thick photosensitive lacquer layer using under-exposure or under-development conditions will only pattern the upper part of the lacquer layer. The membrane layer is then deposited at the deepest part of the pattern directly in contact with the material of the macroporous support. The remaining membrane layer material on top of the pattern as well as the lacquer layer is then removed with a standard lift off technique using for example acetone.

BRIEF DESCRIPTION OF THE DRAWINGS

Hereinafter, the invention will be described in greater detail with reference to a number of specific examples and an accompanying drawing, in which.

DETAILED DESCRIPTION OF THE INVENTION

Figure 1:
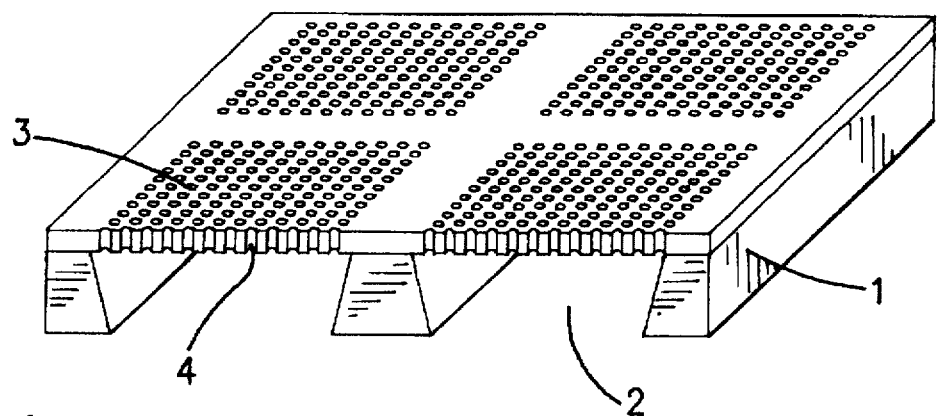
FIG. 1 shows in cross-section a part of a micro filtration membrane filter according to the invention.

The figures are purely schematically and particularly not drawn on scale. Through out the figures, the same reference numerals have been assigned to the same or corresponding parts.

Figure 2:
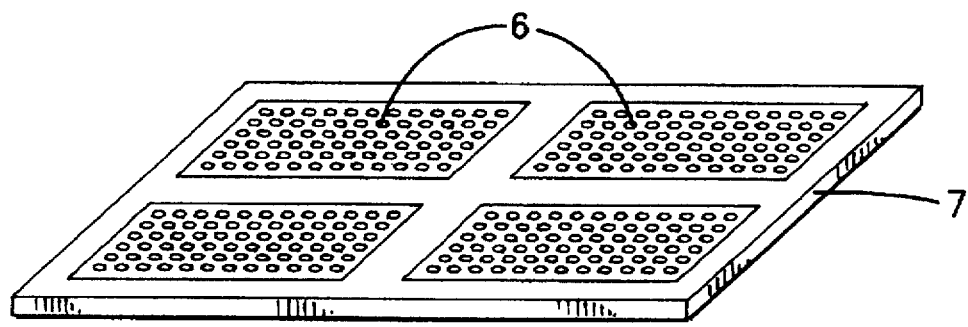
FIGS. 2 and 3 show in cross-section part of a membrane filter according to some preferential examples according to the invention.
Figure 3:
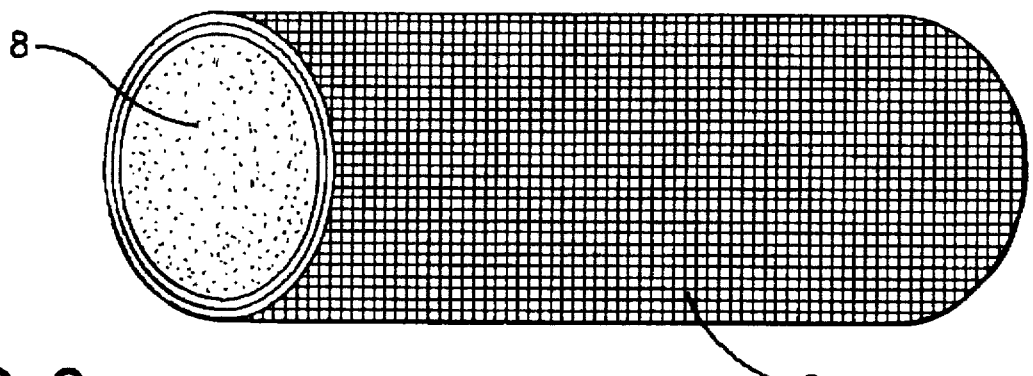
Figure 4:
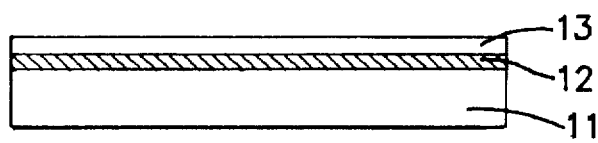
FIGS. 4 to 6, 7a–7c, and 8a–8c; show in cross-section subsequent stages of a process for production of a membrane filter according to the invention.
Figure 5:
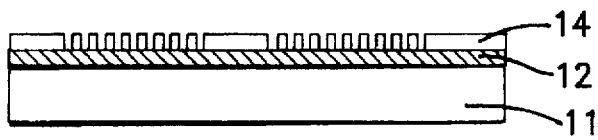
Figure 6:
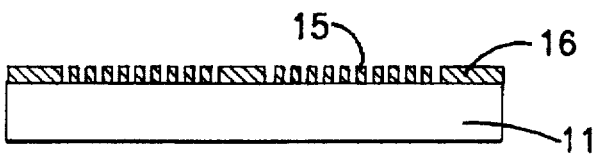
Figure 7A:
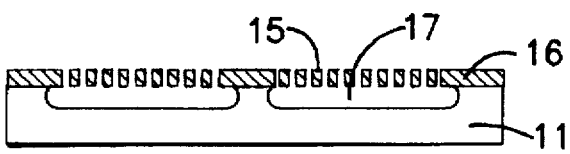
Figure 8A:
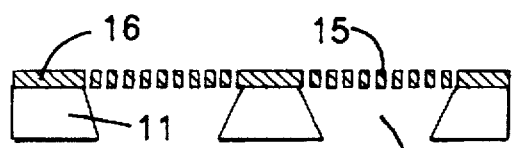
Figure 7B:
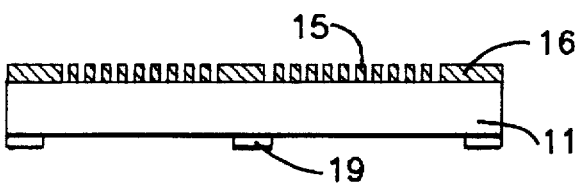
Figure 8B:
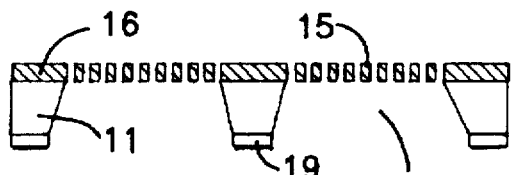
Figure 7C:
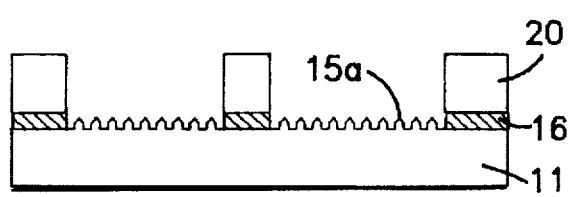
Figure 8C:
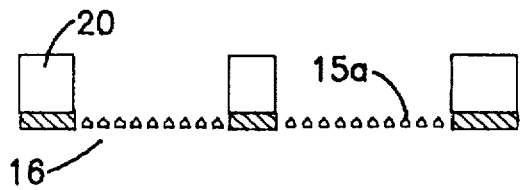
Figure 9:
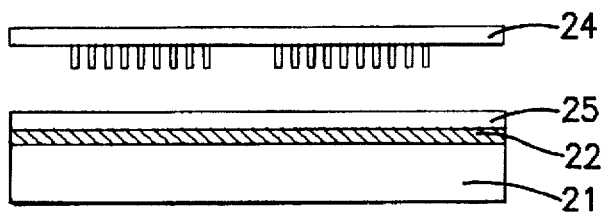
FIGS. 9 to 11 show in cross-section subsequent stages of an other process for production of a membrane filter according to the invention.
Figure 10:
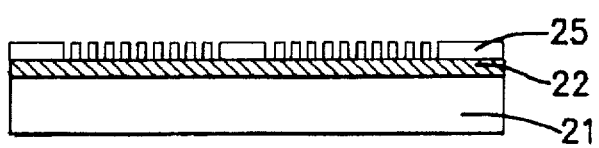

FIG. 1 shows schematically in cross-section a part of the membrane filter according to the invention. The membrane filter consists of a support of bridges 1, in this example a single crystalline silicon wafer <100> with thickness 380 μm and provided with square perforations 2 of 2.5×2.5 mm and a membrane 3 of silicon nitride with thickness 2 μm. The perforations 4 in the membrane layer 3 have a cross-section of 4×4 μm The depth of the perforations 4 (in here 2 μm) are at least smaller than twenty times the diameter of the perforations 4 (40 μm). The distance between the centre of the perforations is here 10 μm. Every square centimeter surface area of the membrane has then 1 million perforations. Depending on the application, other shapes for the cross-section of the perforations 4 may be chosen. A rectangular shape has the advantage that particles will not be able to totally close the perforations. A strongly elongated or channel like shape of the membrane layer has the advantage of a potential high flow rate. A circular or round shape of the cross-section has an advantage in separating media with vulnerable particles, in particular shallow perforations with a rounded and smooth morphology are appropriate for separating biological cells. The surface roughness of a silicon wafer is usually better than 1 nanometer. FIG. 2 shows schematic in cross-section a part of the membrane filter according to the invention. The membrane filter consists of single membrane layer units 6 of polytetrafluoroethylene with thickness 5 μm and size 0.2 mm by 0.2 mm combined with a polytetrafluoroethylene grid 7 of bars for strength with bar dimension 5 μm×20 μm×200 μm. The diameter of the circular shaped perforations is 3 μm. The anisotropic perforations in the membrane layer are obtained by reactive ion etching in a $CHF_3/SF_6/O_2$ mixture with an excess of oxygen. FIG. 3 shows schematic in cross-section a part of a tubular membrane filter according to the invention. The tubular membrane filter consists of a cylindrical support 8, in this example a macroporous alumina tube with diameter 5 cm and a thickness of 1 cm with mean pore size 10 μm. On the support 8 a membrane layer 9 of siliconnitride is being deposited with thickness 1 μm. The perforations in here have been formed with a diameter of 1 μm.

Figure 11:
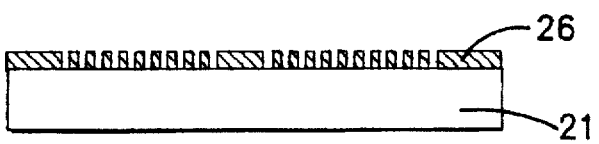
Figure 12A:
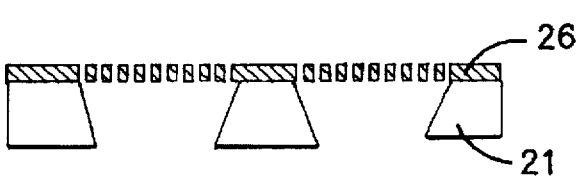
FIGS. 12a, 12b, 13a, 13b, 14a, 14b, 15a, and 15b; show in cross-section subsequent stages of an other process for production of a membrane filter according to the invention.
Figure 12B:
Figure 34:
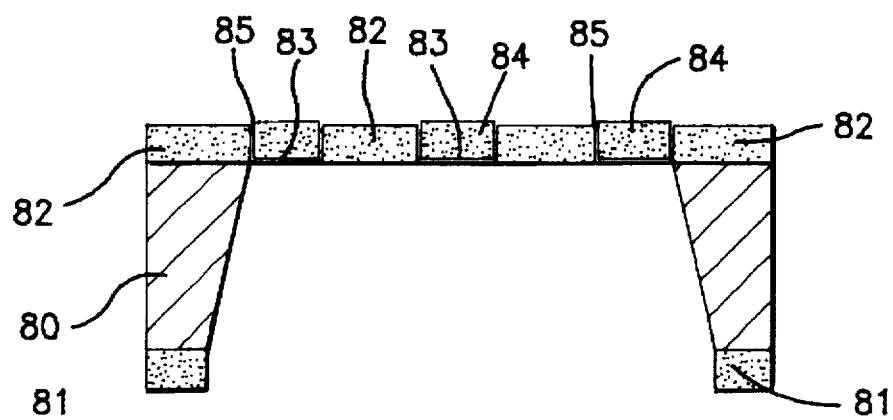
Figure 35:
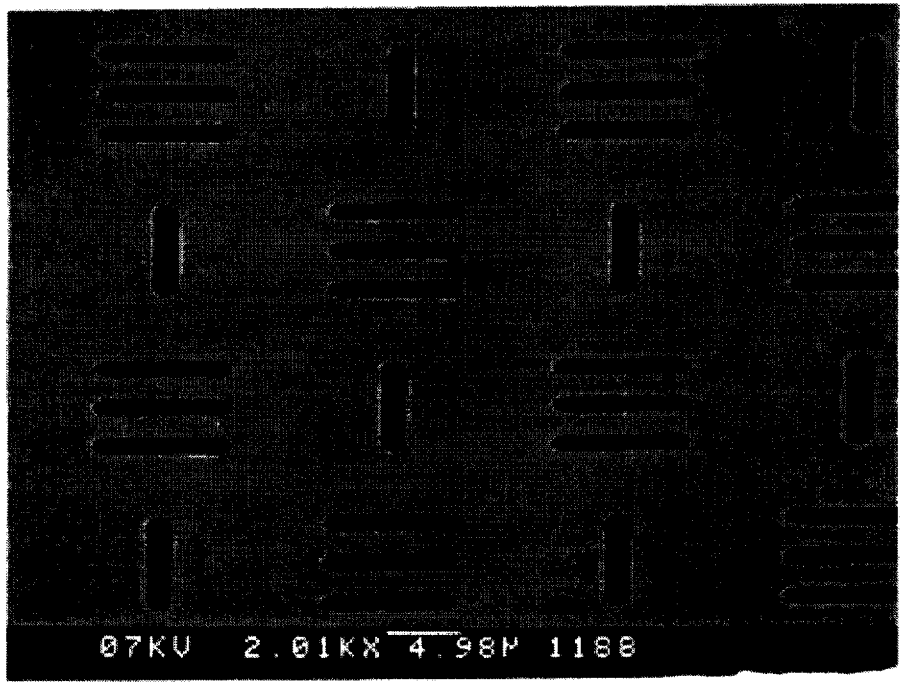
FIG. 35 shows a SEM photograph of a membrane filter with a siliconnitride layer with a thickness of 1 μm and perforation size 1.5×9.0 μm according to the invention.
Figure 36:
FIG. 36 shows a SEM photograph of a gas separation filter with a palladium layer with a thickness of 200 nm in the pores of a membrane according to the invention, the palladium layer being partly removed from the surface by a lift off technique and protruding over the edges of the pores of the otherwise flat membrane.
Figure 37:
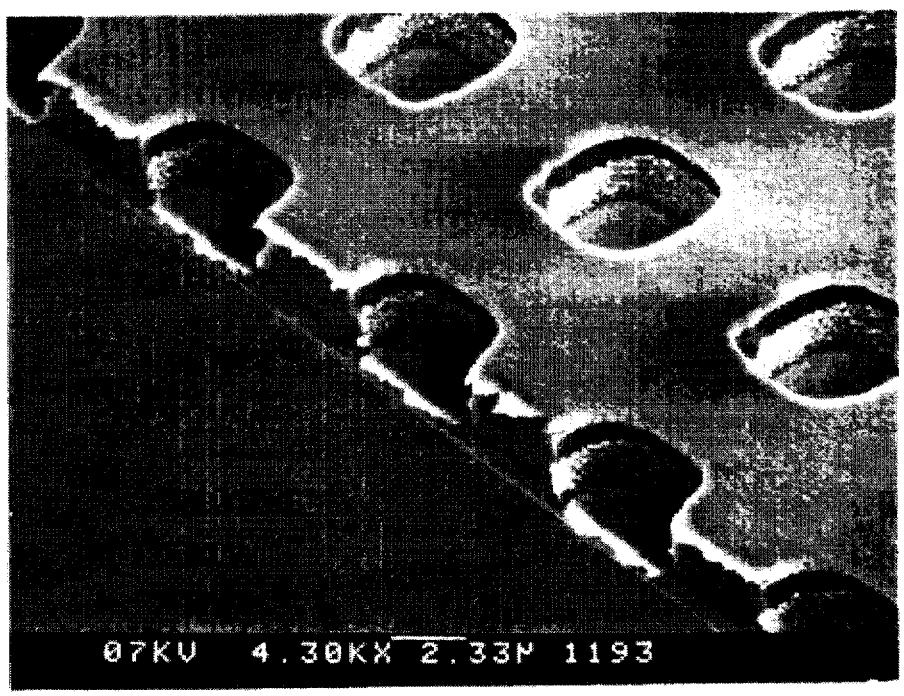
FIG. 37 shows a SEM photograph of an aluminium membrane layer obtained with vapour deposition with a thickness of 0.5 μm and perforation size 4.5 μm deposited on a patterned photo-lacquer layer according to the invention, the membrane layer being removable by a lift off technique.
Figure 38:
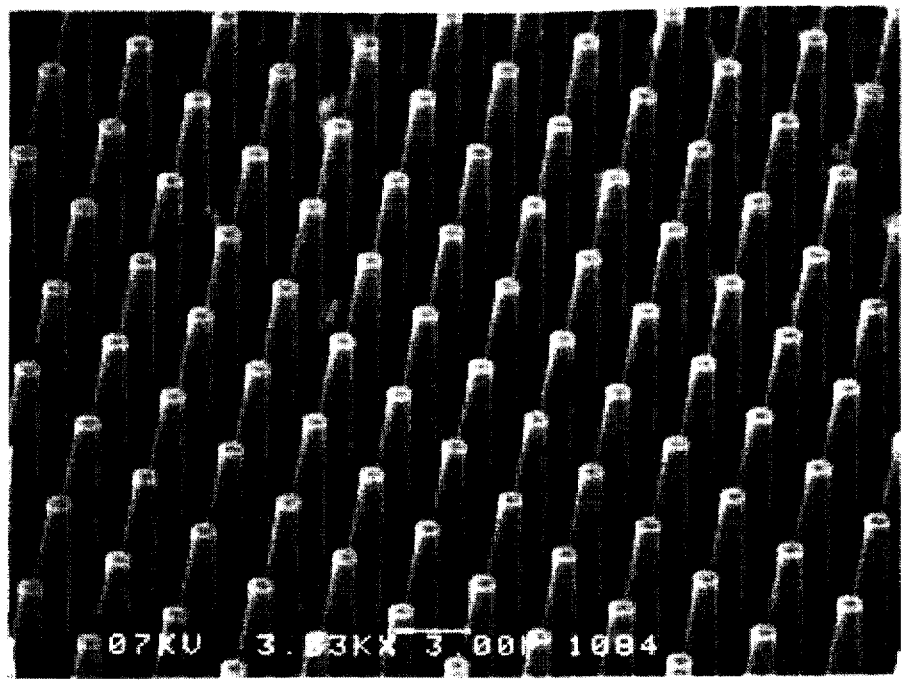
FIG. 38 shows a SEM photograph of a mould or a stamp made in a <100> silicon wafer with tapering pins with pin top diameter 1.0 μm for production of a membrane filter according to the invention.

Referring to FIGS. 9–12, a mould 24 is made with aid of silicon surface micromachining through anisotropic silicon etching of a silicon wafer with a regular pattern of square fields of 5 μm×5 μm as a etching mask. The square fields are made of aluminum using vapour deposition and a lift off technique in acetone, i.e. the vapour deposition of aluminum is done after the provision of a patterned photosensitive photolacquer layer on the silicon wafer. Subsequently, the silicon is anisotropically etched by reactive ion etching in a $CHF_3/SF_6/O_2$ mixture in a 30/20/20 ratio, thus obtaining the mould, see also FIG. 34. After the provision of an imprint of this mould 24 in the polyamide layer 23 then with the aid of anisotropic reactive ion-etching with a $CHF_3O_2$ mixture a membrane layer 26 is formed with a square cross-section of 5×5 μm. FIG. 11. Depending on the size and thickness of the membrane layer, openings may be etched in the metal support 21. FIG. 12a, or the metal support may be totally removed by etching, FIG. 12b. Doing only the latter results in a 2 μm thick free membrane layer 26 that still has mechanical strength over 1–10 cm² membrane area.

Figure 13A:
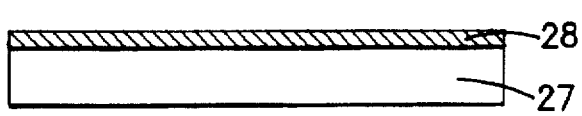
Figure 13B:
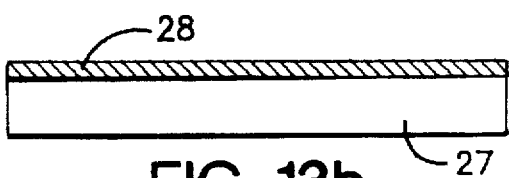
Figure 14A:
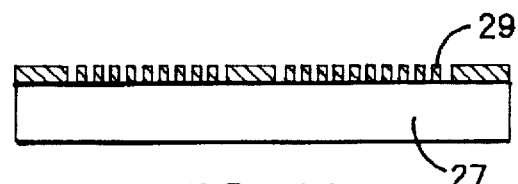
Figure 14B:
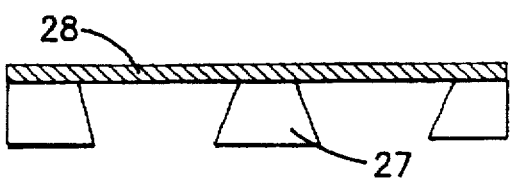
Figure 15A:
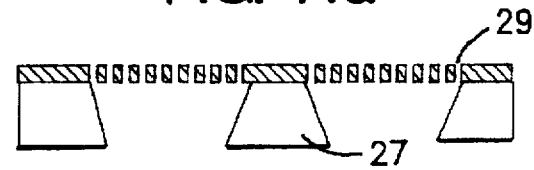
Figure 15B:
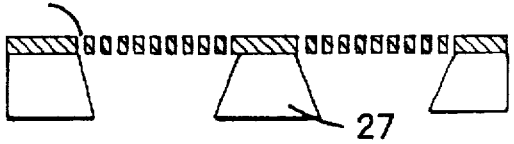
Figure 16:
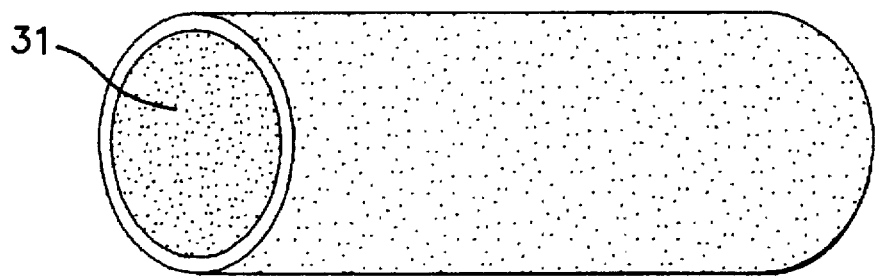
FIGS. 16 to 19 show in cross-section subsequent stages of an other preferential process for production of a membrane filter according to the invention.
Figure 17:
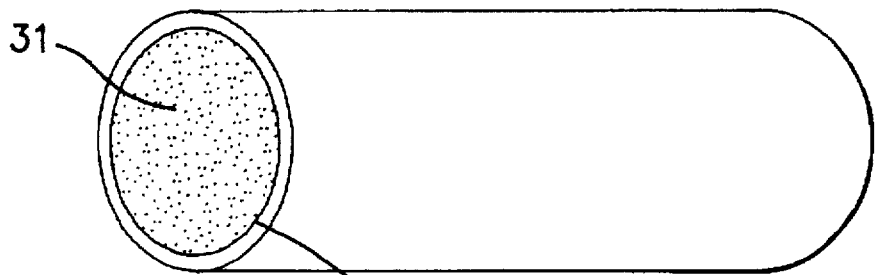
Figure 18:
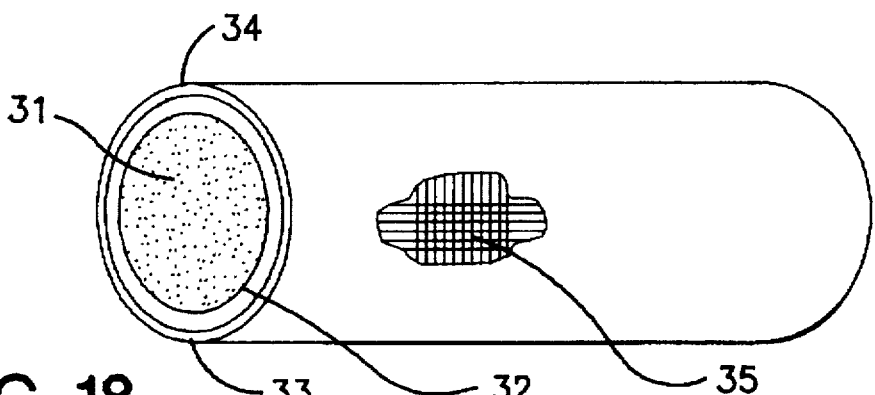
Figure 19:
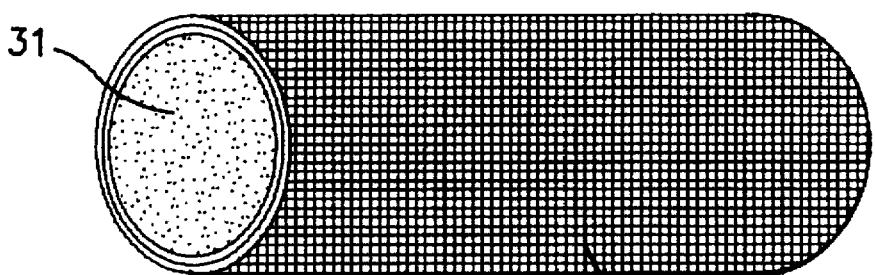

FIGS. 13 to 15 show in cross-section subsequent stages of a process for production of the membrane having a support and a membrane layer according to the invention. On a flat surface of the support 27 in this example, a thin metal wafer of aluminum with thickness of 300 μm a layer 28 of photo sensitive polyamide with thickness 2 μm is deposited by means of a suitable deposition method, here by means of spin coating a solution of prepolymer polyamide, followed by a low temperature baking step. FIG. 13a. The polyamide layer 28 is then being provided with a regular pattern with the use of a suitable exposure technique. Thereafter the polyamide layer 28 is developed and polymerized by a 'postbake' step thus yielding the membrane layer 29 with perforations, FIG. 14a. Depending on the size and thickness of the membrane layer, openings may be formed in the metal support 27, FIG. 15a or the metal support 27 may be totally removed by etching. On demand the order in the making of the perforations in the membrane layer and the making of the openings in the support may be interchanged, FIG. 13b to 15b.

FIGS. 16 to 19 show in cross-section subsequent stages of a preferential process for a tubular membrane filter according to the invention. The tubular membrane filter consists of a cylindrical support 31, in this example a macroporous alumina tube with a diameter of 5 cm, a thickness of 1 cm and with a mean pore size 10 µm, FIG. 16. Before a thin membrane layer is formed, a suitable pore filling material 32 is deposited on the outer surface of the support 31 filling all pores lying at the outer surface of the support 31, FIG. 17. The thickness of the pore filling material 32 is related to the mean pore size of the porous support 31, in order to fill all pores lying at the surface of the support 31. In this example the pores of the porous support 31 of alumina are filled with aluminium 32 by means of a sputter or vapour deposition technique. The aluminum is deposited on the support by a normal sputter method. Other organic, for example polyamide or inorganic materials with a good pore filling capability may also be used. Also a silica gel, which may be removed by sintering at elevated temperatures, may be applied to dense the surface. After the aluminum deposition, a supplementing polishing process is preferably performed, for example with a suitable diamond powder. The polish should be performed until the filled alumina pores are recovered, because of a good contact between the membrane layer and the support 31 in a later stage.

A thin layer 33 of silicon dioxide with a thickness of 1 µm is deposited by means of a suitable deposition method, here by means of low temperature 'Plasma Enhanced Chemical Vapour Deposition'. The layer 33 is formed with silane and oxygen ($SiH_4/O_2$). On the silicon dioxide layer 33, a diluted photo-sensitive lacquer layer 34 with a low viscosity is deposited, FIG. 18, and is uniformly spread by means of 'spin-coating' through rotating the tubular support 31 along its axis. After a 'prebake' step in which the thickness of the photo-lacquer layer 34 is strongly reduced the lacquer layer 34 is being exposed to a regular pattern 35 with the use of an interference pattern with lines 35. The line pattern 35 is made through the overlap of two light beams originating from a monochromatic source, in this case from a Nd-YAG Laser. The line pattern 35 is projected one time along the axis and one time orthogonal to the axis of the tube through a diaphragm, with a diameter that is smaller than the diameter of the tube. Through repeated translation and rotation of the tube, the total area may be exposed to a regular pattern 36 of square fields of 1×1 µm in the photo-sensitive lacquer layer 34. Other projection or imprinting techniques, e.g. proximity projection with a concave or tubular formed mask, or the imprint of a mould in a non photo-sensitive lacquer layer 34 by rolling the tubular support 31 may equally apply. Thereafter, the lacquer layer 34 is developed and the silicon dioxide layer 33 is etched yielding the pattern 36 by use of standard techniques. In this example the layer 33 of silicon dioxide is etched by means of a buffered HF solution, thus forming perforations with a square cross-section of 1 by 1 µm. At last the pore filling aluminum 32 is removed from the pores in the support by use of a diluted KOH solution.

Figure 20:
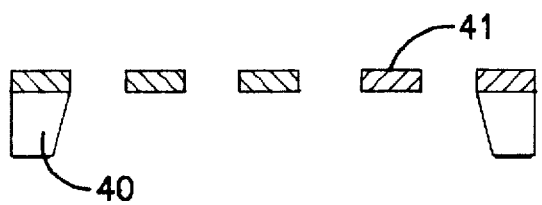
FIGS. 20 to 24 show in cross-section subsequent stages of a process for production of an ultrafiltration membrane according to the invention.

FIGS. 20 to 24 show in cross-section subsequent stages of a process for production of an ultrafiltration membrane according to the invention. FIG. 20 shows a membrane with a support 40 and a microfiltration membrane layer 41, according to the invention. The membrane may be shaped flat as well as tubular. On a surface of the membrane layer 41, in this example, a silicon nitride layer with thickness 1 µm and with perforations with size 1 µm a thin layer 42 is deposited with thickness 2 µm by means of spin coating of a suitable sol-gel, for example a silicon oxide sol, obtained from tetraethyl orthosilicate (TEOS) in ethanol, FIG. 21. Next with a high temperature treatment the microporous ultrafiltration layer 43 is formed. The ultrafiltration layer 43 is almost 'pinhole' and 'crack' free and is solidly sustained in the perforations of the microfiltration membrane layer, FIG. 22. On demand, a second ultrafiltration or gas separation layer 44 may be deposited with a similar or different technique, FIG. 23. As a starting material for a gas separation layer a solution of a 10% silicone elastomer (e.g. SCS 2211, Perfecta Chemie) in ethyl acetate may be used. The high temperature treatment is here pyrolysis in air at 600° C. A gas separation layer is then obtained with mean pore size 1 nm. Another application is that direct on the microfiltration membrane layer 40 and in the perforations of the membrane layer 40 with use of an autoclave molecular sieve crystals 44 are grown, for example zeolite crystals of the type ZSM-5, FIG. 24.

Figure 25:
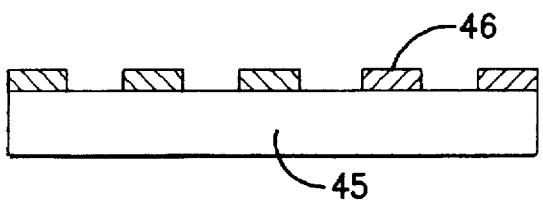
FIGS. 25 to 29 show in cross-section subsequent stages of a process for production of a gas separation filter according to the invention.
Figure 21:
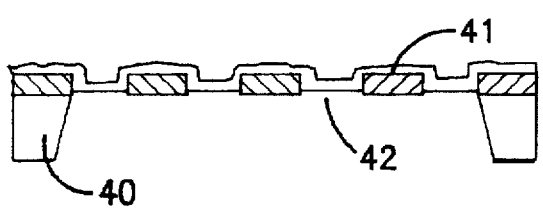
Figure 26:
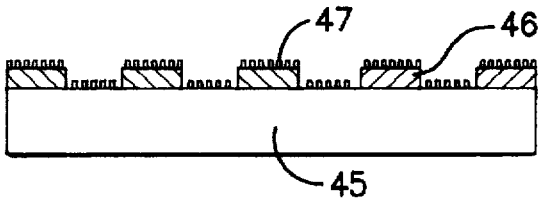
Figure 22:
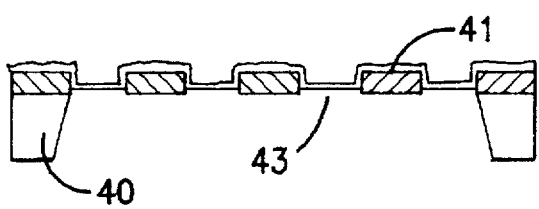
Figure 27:
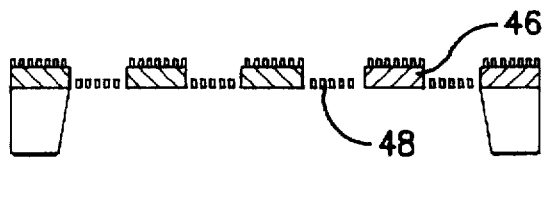
Figure 23:
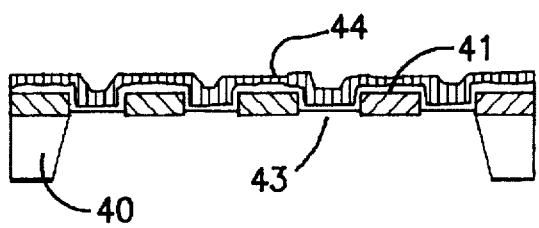

FIGS. 25 to 29 show in cross-section subsequent stages of a process for production of a gas separation membrane with a membrane according to the invention. FIG. 25 shows a membrane with a support 45 of monocrystalline silicon and a membrane layer 46 of silicon nitride, for example obtained according to the invention. The membrane may be flat as well as tubular, the support 45 should however still be dense. On a surface of the membrane layer 46 and in the perforations of the support 45 a palladium layer 47 with a thickness of 0.2 µm is being sputtered, FIG. 26. After the deposition of the palladium layer 47 openings 48 are being etched in the silicon via the backside of the support 45, for example with a 10% KOH aqueous solution at 70° C. or a hydrazine solution at 100° C., the membrane layer 46 is then etched free and the thin palladium layers 48 are solidly sustained in the perforations of the membrane layer 46, FIG. 27.

This process applies equally well for the deposition of other gas separation metal, ceramic or synthetic layers, for example a silver alloy or zirconium oxide layer for oxygen separation or a thin TEFLON layer for helium separation.

Figure 28:
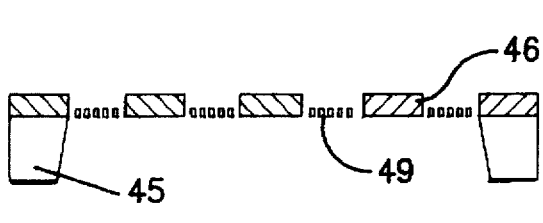
Figure 24:
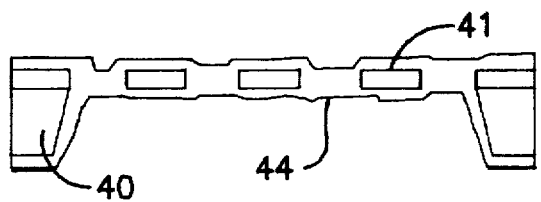
Figure 29:
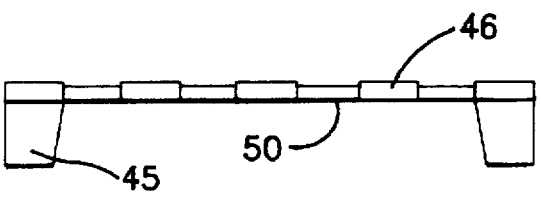

A very thin silicon oxide layer 49 may thus be obtained through an initial oxidation of the silicon support 45 and the subsequent provision of openings 48 in the support 45, FIG. 28.

On a very flat monocrystalline support 45 of silicon very thin monocrystalline gas separating molecular sieve crystal layers 50 may be grown in the perforations of the membrane layer 46. A monocrystalline zeolite layer of the ZSM-5 type with a thickness of 0.5 µm is grown in the perforations 46 on the monocrystalline silicon 45 in an autoclave at a temperature of 150° C. for 4 hours starting with an aqueous solution of tetraethyl or the silicate (TEOS), and tetrapropyl ammonia in a molecular amount of 7:1. After the growing of the ZSM-5 layer 50 openings in the support 45 are etched with a 10% KOH solution at 70° C., or an aqueous solution of ethylenediamine and prycatechol (EDP) at 70° C., FIG. 29. The gas separation channels in the zeolite layer 50 are opened through calcination and can be done before or after the provision of the openings in the support 45.

The invention could also use a part of a fractionating system for sorting particles on size having a number of filtration membranes. In a substrate, in this example a silicon wafer, three mutually connected channel are realized via three filtration membranes which are connected with three drains. The filtration membranes are in this example of silicon nitride and have respectively pore sizes 0.5 µm, 1.5 µm and 5 µm. By means of an input channel, a suspension of particles with different sizes are permitted to the input of a first channel. Out of this suspension the particles with a size less than 0.5 µm will permeate through the first filtration membrane to the first drain. The end of the first channel is connected with the input of the second channel. Through the second channel particles will permeate to the second drain with a size between 0.5 µm and 1.0 µm passing the second filtration membrane. The end of the second channel is connected with the input of the third channel. Through the third channel particles with sizes smaller than 1.5 µm will permeate to the third drain the third passing filtration membrane. The residue with particles larger than 1.5 µm will flow via the end of the third channel to a drain. In this example the three channels are dry etched in the silicon substrate with a depth of 50 µm. The width of the filtration membranes is 500 µm and the length is 5 cm. With these dimensions, a good separation of particles with respect to size is possible in a 'cross flow' configuration.

Figure 31:
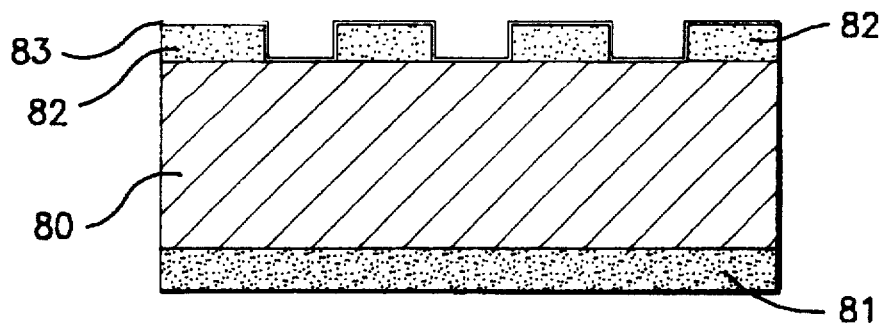
FIG. 31 to 34 show in cross-section subsequent stages of a method of manufacturing a membrane filter with ultra fine pores according to the invention.
Figure 32:
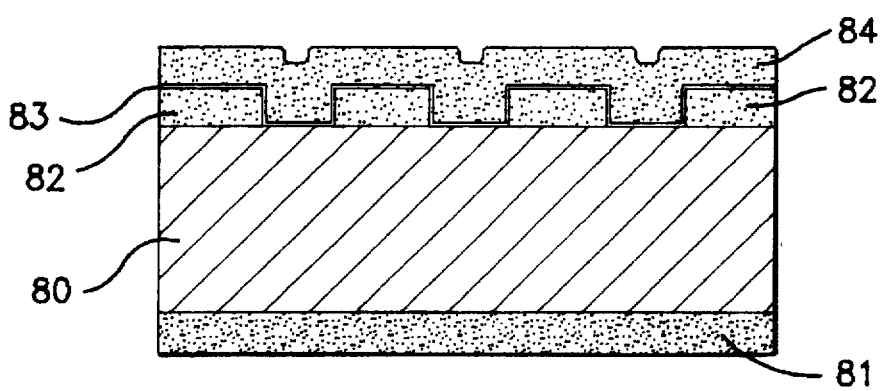
Figure 33:
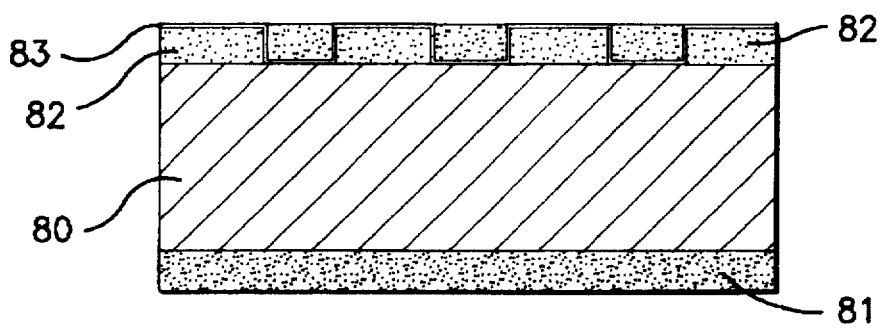

FIGS. 31 to 34 show in cross section subsequent stages of a method of manufacturing a membrane filter according to the invention with ultra fine pores. FIG. 31 shows a membrane filter with a support 80 of monocrystalline silicon and a membrane layer 82 of silicon nitride with thickness 1 □m in which parallel grooves with a depth of 1 □m and a length of 10 □m are being etched according to above described techniques. A sacrificial layer 83 of silicon dioxide is grown uniformly with a uniform thickness of 20 nm by means of chemical vapour deposition of tetra ethoxysilane at elevated temperature. Square to the grooves a line pattern (not shown in the figures) is etched in the sacrificial layer 83 with a depth of 20 nm, a width of 1 □m, a length of 1000 □m and a spacing of 10 □m with standard lithographic techniques using a buffered HF solution as a selective etchant. Over the sacrificial layer 83 and in the grooves a groove filling layer 84 with a thickness of 2 □m is deposited, FIG. 32. The groove filling layer 84 is then planarized by polishing or etching such that the grooves remain at least partially filled with groove filling material, FIG. 33 and the groove filling material 84 is at least partially directly connected to the membrane layer 82 near the line pattern. Subsequently, the sacrificial layer 83 is removed from using the buffered HF solution such that channel like pores 85 with a width of 20 nm, a depth of 1 □m and a lateral length of 10 □m are realized, FIG. 34. Openings are etched in the support 80 using KOH as an etchant and the patterned silicon nitride layer 81 as an etch mask. With the process it is possible to make very small pores without alignment of the mask for the parallel grooves and the mask for the line pattern.

From the above it may be clear that the present invention is not limited to the mentioned examples, but that for the skilled specialist many variations of the invention will be possible. For instance the material of the membrane layer or the support may be inorganic, glass-like, a ceramic matrix composite, ceramic, polymeric, a semiconductor, a metal or an alloy etc. Many materials may be etched isotropically with use of wet or dry etchants, or anisotropically by means of reactive ions using gases based on oxygen, chlorine or fluorine for inorganic materials and mainly oxygen for polymeric materials. An intermediate layer between the membrane layer and the support may be applied as a selective etch stop, for example chromium, aluminum, some noble metals etc. for reactive ion etching based on fluorine gases. An intermediate layer may also be applied in enhancing the joining strength and temperature stability between the support and the membrane layer, for example borax, diphosphorous pentoxide, titanium tantalium etc. Very smooth supports with a surface roughness less than 100 nm, particularly less than 50 nm, may be obtained, for example with KOH etching of monocrystalline silicon. Very smooth perforations with a surface roughness less than 100 nm, particularly less than 10 nm, may be obtained with controlled dry etching techniques. In case the openings of the support have a circular cross section relatively strong membrane layers with a small intrinsic stress may be obtained in comparison with rectangular shaped cross sections. The pattern in the membrane layer is not limited to the use of a mask, the regularity of the pattern may also be obtained by means of an interference pattern or by means of a modulated laser beam. The invention is also not restricted to the use of optical lithography, other lithographic techniques with higher resolution (submicron), like Electron Beam and X-Ray are likewise appropriate. In the manufacturing process of the membrane other process techniques may be used, essential however is the use of a 'thin film' technology. The use of epitaxial grown thin layers has the advantage that etching along preferential crystal planes will result in very well defined positively tapering perforations at a given uniform thickness of the thin membrane layer, for example perforations with positive tapering along the <111> planes in a <100> monocrystalline silicon layer. A different sequence of process steps may be chosen, for example openings in the support may already be produced before perforations are formed in the membrane layer. A still dense membrane layer may also first be provided with a very thin ultrafiltration or gas separating layer on one side before perforations are etched in the membrane layer via the other side using an etch stop at the ultrafiltration or gas separating layer. An ultrafiltration or gas separating layer of 'porous silicon' may also be obtained in situ with use of local anodic etching of a silicon layer. A gas separating layer may also be made microporous with use of ion bombardments at high energies in combination with a 'rack etching' technique.

The invention is also not restricted to a support with only one membrane layer, more sophisticated membrane layer patterns or even a plurality of accumulated membrane layers are possible. The support may be provided with more than one membrane layer, for example formed by the use of at least one 'sacrificial' layer. In case the distance of two membrane layers with non-overlapping perforations (in top view) is chosen smaller than the diameter of the perforations in these layers, then the effective pore size is mainly determined by this distance. This distance may be well defined by the thickness of a 'sacrificial' layer between the two membrane layers. The invention applies also to a membrane with a single membrane layer without a support. A support, for example a double sided polished silicon wafer, may also be provided on both sides with a membrane layer according to the invention, both membrane layers having for example a different pore size. The membrane layer having the largest pore size may then be used as a prefilter. A microfiltration membrane with one or two membrane layers may also be applied as a mixer to mix liquids or gases. A microfiltration membrane with two electrical conducting membrane layers which are mutually electrically isolated, or one electrical isolating membrane layer with on both sides an electrical conducting layer may also be applied as an Electro (or Magneto) Hydro Dynamical pump (EHD pump). The same membrane layer provided also with electrically charged perforations with an ionopore material may be used for electric field enhanced electrodialysis for the removal of small ions from blood or salt water. An EHD pump may also be used to create a pulsated flow and is particularly useful as anti fouling means for the membrane.

The membrane may be used as a leucocyte filter, separating leucocytes from erythrocytes and or blood platelets or in a broader sense as a biomedical separation filter in a filtration system, for example a filter for sterile filtration, or a filter for the extraction of blood plasma from whole blood, in particular in a cross flow configuration. The membrane may also be used as a separation filter, for instance for 'in vivo' screening of blood cells, or in a sensor, or actuator system. This will give a clear advantage for microsensors and actuators that (as well as the micro filtration membranes according to the invention) are processed with use of thin film technology.

A microfiltration membrane having an ultrafiltration layer according to the invention may also be applied as a 'Reverse Osmosis' filter, for example for the desalination of salt water. A membrane having an ion exchange layer in or over the pores, for example a per-fluorinated polymer like Nafian or a polymer of a quaternary ammonium type, may be used as a high flow rate ion exchange membrane or as a separator in electrolytic cells.

A microfiltration membrane with a gas separating zeolite layer according to the invention may also be used as a catalyst, for example through the use of platinum or palladium atoms in the micropores of the zeolite, for example through the exchange of cations from the zeolite with a Pt or Pd complex ion, e.g. $Pd(NH_3)_4^{2+}$ followed by a reduction of the Pd or Pt ions to atoms. A microfiltration membrane with a silicon-rich zeolite layer according to the invention may be applied as a very thin $H^+$ ion exchange device in a fuel cell. The zeolite layer may also be applied by means of vapour deposition or sputtering.

A microfiltration membrane for economic applications may be constructed with a metal or synthetic support with large openings for example larger than 100 µm. The support sustains a very thin synthetic foil, for example a polyamide layer with a thickness of a few microns or less. In the polyamide foil then according to the invention, perforations are produced by means of an etching process with a mask, for example an etching process with reactive ions with use of a shadow mask. As a substrate for a microfiltration membrane according to the invention a perforated support with a thin and dense (membrane) layer may be used, for example a substrate that is made with use of a LIGA (Lithografische Galvano Abformung) technique.

A mould processed with use of silicon micromachining according to the invention for the imprinting of a pattern in a pattern forming layer may also be used for direct perforating a very thin membrane foil, or may be used as a mould for injection moulding or hot embossing of a very thin filtration membrane. A mould being covered at the top of the pins with a thin plate may also be applied as a microfiltration device, the effective pore size being determined by the distance between the pins.

Perforated membranes according to the invention may also be applied for an optical filter or an extrusion device for the production of ultra thin fibres, latex dispersions, lipid bilayer liposomes, etc.

Little modules with at least one filtration membrane according to the invention are very well suited for micro analysis systems and 'micro liquid handling devices' which also are processed by means of 'silicon micromachining'.

The pattern in the auxiliary, pattern forming layer of the method according to the invention may for instance alternatively be formed by using particles with a uniform size, for example a silica dispersion or a latex suspension, with particle sizes ranging from 5 nm to 5 µm. Dispersions with large particles (>100 nm) may be added to the pattern forming layer. A more or less ordered distribution of particles will then be found in the pattern forming layer on the support. When using a wet or dry etching process with a higher etching rate for the particles than in comparison to the pattern forming itself, perforations in the pattern forming layer and subsequently in the membrane layer will be etched at the location of the particles. 'Liquid Crystal' suspensions may also be used for this purpose. Dispersions with small or large particles may also directly be formed on a substrate with use of a spin coating, or evaporation technique. After the evaporation of the solvent of the dispersion a very thin metal layer, e.g. a 10 nm chromium layer may be deposited, e.g. by means of vapour deposition, on the substrate and on top of the particles for example silica particles with diameter 30 nm. The silica particles are then being solved in a buffered HF solution and a perforated chromium layer remains with perforations of approximately 20–30 nm in diameter depending on the chromium deposition conditions (correction for shadow effect of deposition). The chromium layer may be used as a membrane layer or alternatively as a mask layer for the (dry) etching of a membrane layer underneath the chromium layer.

I claim:

1. Membrane filter comprising a membrane provided with pores of a size between 5 nm and 50 µm characterized in that said membrane comprises a substantially flat layer of substantially uniform thickness with a surface roughness which is considerably less than the pore size and in that the pores are etched in said substantially flat layer.

2. Membrane filter according to claim 1 characterized in that the membrane thickness is smaller than the average pore size and in that the membrane has a pore density which is larger than 1 million per square centimeter.

3. Membrane filter according to claim 1 characterized in that the membrane as well as the inner surface of the pores have a surface roughness less than 100 nm, and in that the membrane has a thickness which is smaller than the averages diameter of the pores.

4. Membrane filter according to claim 1 characterized in that the pores consist of etched perforations with relatively smooth edges and in that the membrane features a relatively sharp, well defined pore size distribution within a standard deviation of less than 3%.

5. Membrane filter according to claim 1 characterized in that the membrane is carried by a macroporous support with at least one opening at its surface which is spanned by the membrane.

6. Membrane filter according to claim 5 characterized in that the pores are provided within said at least one opening merely at a distance from its boundary and at a distance from its center.

7. Membrane filter according to claim 5 characterized in that the support is at least partially composed of a monocrystalline silicon wafer.

8. Membrane filter according to claim 5 characterized in that an intermediate layer is present: between the membrane and the support, which intermediate layer provides for bonding enhancement and/or stress relief and comprises a member selected from the group consisting of borax, chromium, nickel, tantalum, aluminum, silicon oxide or phosporous pentoxide.

9. Membrane of the kind applied in the membrane filter according to claim 1.

10. Gas separation filter or an ultra filtration comprising a membrane as claimed in claim 9 characterized in that a gas separation layer respectively an ultra filtration layer is provided in or over the pores of said membrane.

11. Gas separation filter or an ultra filtration filter as claimed in claim 10 characterized in that the gas separation or ultra filtration layer has a thickness below 200 nm and comprises porous silicon.

12. Fractionating system for sorting particles on size comprising at least one membrane as claimed in claim 9.

13. Pump comprising a membrane as claimed in claim 9.

14. Membrane with a monocrystalline molecular sieve crystal obtained by means of the membrane filter according to claim 1.

15. Leuckocyt filter comprising a membrane filter as claimed in claim 1.

16. Method of manufacturing a membrane filter comprising a support which is covered by a membrane having pores of a size between 5 nm and 50 μm characterized in that a membrane layer is deposited on said support, in that the pores are etched in the membrane layer is provided with pores by means of a patterned auxiliary layer and in that at least one recess is etched from the backside and over the entire thickness of the support in order to expose the backside of the membrane layer.

17. Method according to claim 16 characterized in that the membrane layer is deposited by means of epitaxial growth, spin coating, vapour deposition or sputtering with a thickness between 20 μm and 5 nm, having a thickness uniformity below 10 nm and 100 nm respectively, and with a surface roughness which is considerably less than the pore size.

18. Method according to claim 16 characterized in that the auxiliary layer comprises a deposited masking layer which is patterned by means of a homogeneous mixture of particles added to it before its deposition.

19. Method according to claim 16 characterized in that the pores of the membrane layer are narrowed by coating with an additional layer, by means of spraying, lacquering, spin coating, vapour deposition or sputtering.

20. Method of manufacturing an ultra filtration filter or gas separation filter in which a silicon substrate is covered by a membrane according to claim 9, characterized in that an ultra filtration layer or a gas separation layer is deposited on said membrane, and in that the substrate is locally etched from its back side towards the membrane on top of it in order to expose the back side of the ultra filtration layer or gas separation layer respectively.

21. Method of manufacturing a membrane with ultra fine perforations characterized in that a first layer is deposited on a substrate which is provided with substantially parallel grooves which are deeper man wide, in that a sacrificial layer is conformally deposited over the surface, in that the sacrificial layer is provided with substantially parallel grooves which extend substantially traverse to the grooves in the first layer, in that a second layer is deposited over the entire surface covering the sacrificial layer and filling the grooves, in that the second layer is etched back until the lateral parts of the sacrificial layer are exposed, in that the exposed parts of the sacrificial layer are removed by etching and in that the substrate is etched through the realised openings in the sacrificial layer.

* * * * *